(12) United States Patent
Bedell et al.

(10) Patent No.: US 10,559,555 B2
(45) Date of Patent: *Feb. 11, 2020

(54) MICRO-LED ARRAY TRANSFER

(71) Applicant: International Business Machines Corporation, Armonk, NY (US)

(72) Inventors: Stephen W. Bedell, Wappingers Falls, NY (US); Bing Dang, Chappaqua, NY (US); Ning Li, White Plains, NY (US); Frank R. Libsch, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/940,513

(22) Filed: Mar. 29, 2018

(65) Prior Publication Data
US 2018/0219005 A1     Aug. 2, 2018

Related U.S. Application Data

(63) Continuation of application No. 15/416,439, filed on Jan. 26, 2017, now Pat. No. 10,002,856.

(51) Int. Cl.
*H01L 25/075* (2006.01)
*H01L 33/62* (2010.01)

(52) U.S. Cl.
CPC ................. *H01L 25/0753* (2013.01)

(58) Field of Classification Search
None
See application file for complete search history.

(56) References Cited

U.S. PATENT DOCUMENTS

| | | | |
|---|---|---|---|
| 6,214,733 B1 | 4/2001 | Sickmiller | |
| 2004/0126911 A1 | 7/2004 | Kimura | |
| 2010/0110157 A1 | 5/2010 | Yonehara et al. | |
| 2010/0186883 A1* | 7/2010 | Tomoda | H01L 25/0753 156/220 |
| 2011/0003410 A1 | 1/2011 | Tsay et al. | |
| 2011/0151588 A1* | 6/2011 | Ashdown | H01L 21/6835 438/3 |
| 2011/0151602 A1 | 6/2011 | Speier | |
| 2013/0285086 A1* | 10/2013 | Hu | H01L 27/156 257/98 |
| 2015/0023023 A1* | 1/2015 | Livesay | H01L 33/642 362/294 |
| 2016/0336304 A1* | 11/2016 | Wu | H01L 21/6835 |
| 2017/0162552 A1 | 6/2017 | Thompson | |

FOREIGN PATENT DOCUMENTS

WO    2016100657 A2    6/2016

OTHER PUBLICATIONS

List of IBM Patents or Patent Applications Treated as Related dated Mar. 29, 2018, 2 pages.

* cited by examiner

*Primary Examiner* — Angel Roman
(74) *Attorney, Agent, or Firm* — Scully, Scott, Murphy & Presser, P.C.; L. Jeffrey Kelly, Esq.

(57) ABSTRACT

Methods of transferring micro-array LEDs of various colors onto a surface of a display substrate are provided. The transferring includes releasing micro-LEDs of a specific color from a structure that includes a releasable material onto a display substrate. The releasable material may be a laser ablatable material or a material that is readily dissolved in a specific etchant.

29 Claims, 11 Drawing Sheets

MICRO-LED ARRAY TRANSFER

BACKGROUND

The present application relates to micro-light emitting diodes (LEDs) which are present on a display substrate, and more particularly to various methods of transferring micro-LEDs from a temporary support substrate to a surface of a display substrate.

A light emitting diode (LED) is a two-lead semiconductor light source. An LED is a p-n junction diode, which emits light when activated. When a suitable voltage is applied to the leads, electrons are able to recombine with electron holes within the device, releasing energy in the form of photons. This effect is called electroluminescene, and the color of the light (corresponding to the energy of the photon) is determined by the energy band gap of the semiconductor material used to provide the p-n junction.

There is an interest in fabricating high resolution display technology using multiple colored micro-LEDs (i.e., LED chiplets) to form individual pixels. An important challenge lies in the precise placement of individual micro-LEDs corresponding to the different colors. Although technologies exist which combine temporary bonding and release of singulated LEDs, the placement precision required, while retaining high throughput and low-cost, remains lacking.

SUMMARY

Methods of transferring micro-array LEDs of various colors onto a surface of a display substrate are provided. The transferring includes releasing micro-LEDs of a specific color from a structure that includes a releasable material onto a display substrate. The releasable material may be a laser ablatable material or a material that is readily dissolved in a specific etchant.

In one embodiment, the method includes providing, in any order, a first structure containing a plurality of adhesive structures on a surface of a release layer that is located on a handler substrate, and a second structure containing a first set of LEDs on a temporary support substrate. Next, a preselected number of LEDs of the first set of LEDs is transferred to the first structure by adhering a physically exposed surface of each adhesive structure to one of the LEDs of the first set of LEDs. The preselected number of LEDs of the first set of LEDs that have been transferred to the first structure are now transferred to a surface of a display substrate by contacting a physically exposed surface of each of the preselected number of LEDs of the first set of LEDs to the surface of the display substrate and removing the release layer. These steps may be repeated at least twice to transfer a second set of LEDs and a third set or LEDs to the display substrate, wherein the transferred first set of LEDs emits a first color, the transferred second set of LEDs emits a second color that differs from the first color, and wherein the transferred third set of LEDs emits a third color that is different from the first color and the second color.

In another embodiment, the method includes providing, in any order, a first structure containing a release layer that is located on a handler substrate, and a second structure containing a first set of LEDs on a temporary support substrate, wherein an adhesive structure is located on a surface of a preselected number of the LEDs of the first set of LEDs. Next, the preselected number of LEDs of the first set of LEDs is transferred to the release layer of the first structure by adhering a physically exposed surface of each adhesive structure to the release layer. The preselected number of LEDs of the first set of LEDs is thereafter transferred from the first structure to a surface of a display substrate, wherein the second transferring includes contacting a physically exposed surface of each of the preselected number of LEDs of the first set of LEDs to the surface of the display substrate and removing the release layer. These steps may be repeated at least twice to transfer a second set of LEDs and a third set or LEDs to the display substrate, wherein the transferred first set of LEDs emits a first color, the transferred second set of LEDs emits a second color that differs from the first color, and wherein the transferred third set of LEDs emits a third color that is different from the first color and the second color.

In a further embodiment, the method includes providing a first set of LED chiplets on a surface of a temporary support substrate; and transferring a predetermined number of LED chiplets of the first set of LED chiplets to a display substrate by releasing the predetermined number of LED chiplets from temporary support substrate. These steps may be repeated at least twice to transfer a second set of LEDs and a third set or LEDs to the display substrate, wherein the transferred first set of LEDs emits a first color, the transferred second set of LEDs emits a second color that differs from the first color, and wherein the transferred third set of LEDs emits a third color that is different from the first color and the second color.

DETAILED DESCRIPTION

Figure 1:
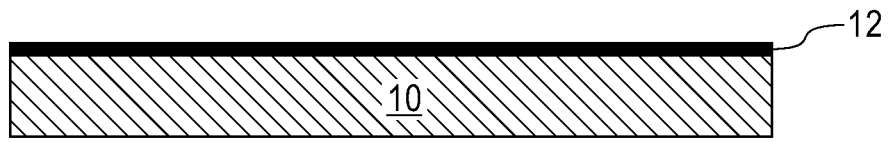
FIG. 1 is a cross sectional view of a first exemplary structure including a release layer located on a surface of a handler substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1-11, there is illustrated a first method of the present application in which micro-LEDs (i.e., LED chiplets) of various colors (e.g., red, blue and green) can be transferred to a display substrate by utilizing a photo-patternable polymer and a release layer. In this embodiment, a structure is provided that includes a plurality of adhesive structures located on a surface of a release layer which is present on a handler substrate. This structure is then brought into contact with another structure containing a plurality of LEDs that emit a first color such that the each patterned adhesive structure contacts, and adheres to, one of the LEDs. Some of the LEDs are thus transferred to the structure containing the handler substrate, the release layer and the plurality of adhesive structures. This structure is then brought into contact with a display substrate and thereafter the LEDs and the adhesive structures are transferred to the display substrate utilizing a release process such as, for example, laser ablation, to transfer each of the LEDs and the adhesive structures to the display substrate. This processing can be repeated at least twice to transfer a second set of LEDs that emit a second color and a third set of LEDs that emit a third color to the display substrate. In the present application, the first color is different from the second color, and the third color is different from both the first and second colors.

Referring first to FIG. 1, there is illustrated a first exemplary structure that can be employed in accordance with an embodiment of the present application. The first exemplary structure of FIG. 1 includes a release layer 12 located on a surface of a handler substrate 10. In the embodiment illustrated, the release layer 12 is a continuous layer that is present on an entirety of the handler substrate 10.

The first exemplary structure of FIG. 1 can be formed by first providing the handler substrate 10. The handler substrate 10 may be composed of any handler material including, but not limited to, glass or silicon. The handler substrate 10 may have a thickness from 500 microns to 1000 microns. Other thicknesses that are lesser than, or greater than, the aforementioned thickness values may also be used as the thickness of the handler substrate 10.

After providing the handler substrate 10, release layer 12 is formed on a surface of the handler substrate 10. In one embodiment, the release layer 12 may include any laser ablatable material that can be readily removed from the handler substrate 10 during a subsequent laser ablation process. In such an embodiment, release layer 12 may be referred to as a laser release layer. Laser ablation is a process of removing a material from a surface of another material by irradiating the material with a laser beam. In one example, the laser ablatable material that can be used as the release layer 12 is a carbon black rich polymer such as, for example, 3M LTHC®. By 'carbon black rich', it meant a polymeric material that contains greater than 20 wt. % carbon black.

In another embodiment, the release layer 12 may be a material that can be selectively dissolved in a suitable etchant. In one example, BrewerBOND® 701 (Brewer Science, Inc), may be used as a release layer 12 that may be dissolved in an etchant.

The release layer 12 may be formed utilizing a deposition process such as, for example, chemical vapor deposition, plasma enhanced chemical vapor deposition, evaporation, or spin-on coating. The release layer 12 may have a thickness from 100 nm to 2000 nm. Other thicknesses that are lesser than, or greater than, the aforementioned thickness values may also be used as the thickness of the release layer 12.

Figure 2:
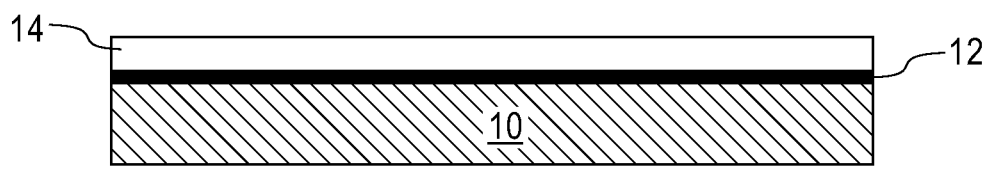
FIG. 2 is a cross sectional view of the first exemplary structure of FIG. 1 after forming a photo-patternable adhesive layer on a physically exposed surface of the release layer.

Referring now to FIG. 2, there is illustrated the first exemplary structure of FIG. 1 after forming a photo-patternable adhesive layer 14 on a physically exposed surface of the release layer 12. As is shown, the photo-patternable adhesive layer 14 is a continuous layer that is formed on an entirety of the release layer 12. The photo-patternable adhesive layer 14 includes any photoimageable polymeric material that can be patterned directly, without utilizing a separate photoresist material. Examples of photoimageable polymers that can be used in the present application include, but are not limited to, polydimethylsiloxane, photo-patternable silicon, BCB (i.e., benzocyclobutene) or PSPI (i.e., a photosensitive polyimide). The photo-patternable adhesive layer 14 may be formed utilizing a deposition process such as, for example, chemical vapor deposition, plasma enhanced chemical vapor deposition, evaporation or spin-on coating. The photo-patternable adhesive layer 14 may have a thickness from 5,000 nm to 20,000 nm. Other thicknesses that are lesser than, or greater than, the aforementioned thickness values may also be used as the thickness of the photo-patternable adhesive layer 14.

Figure 3:
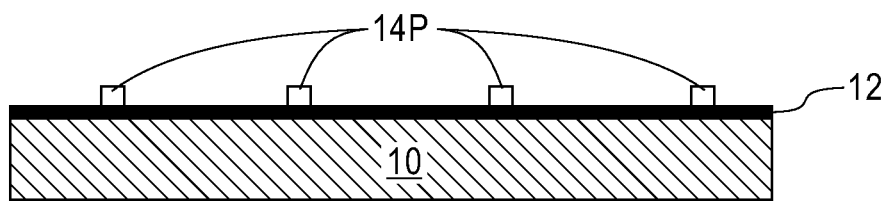
FIG. 3 is a cross sectional view of the first exemplary structure of FIG. 2 after patterning the photo-patternable adhesive layer to provide a plurality of adhesive structures on the release layer.

Referring now to FIG. 3, there is illustrated the first exemplary structure of FIG. 2 after patterning the photo-patternable adhesive layer 14 to provide a plurality of adhesive structures 14P on the release layer 12. Each adhesive structure 14P is composed of a remaining portion of the photo-patternable adhesive layer 14 (i.e., a photo-patterned adhesive). The patterning of the photo-patternable adhesive layer 14 may be performed by exposing the photo-patternable adhesive layer 14 to a desired pattern of radiation, and developing the exposed photo-patternable adhesive layer 14 utilizing a conventional resist developer. No separate photoresist material or a pattern transfer etch is required to pattern the photo-patternable adhesive layer 14.

Each adhesive structure 14P that is formed is spaced apart from a neighboring adhesive structure 14P. Thus, there is no direct physical contact between the various adhesive structures 14P that are formed on the release layer 12. Each adhesive structure 14P is designed to have a shape and dimension of a micro-LED. In one embodiment, each adhesive structure 14P has a length from 3000 nm to 100,000 nm and a width from 3000 nm to 100,000 nm. Other lengths and widths are also contemplated and thus the present application is not limited to using the aforementioned lengths and widths.

Figure 4:
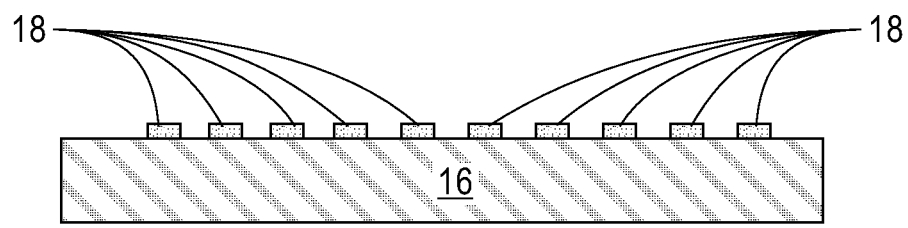
FIG. 4 is a cross sectional view of a second exemplary structure including a first set of light emitting diodes (LEDs) on a surface of a temporary support substrate that can be employed in accordance with an embodiment of the present application.

Referring now to FIG. 4, there is illustrated a second exemplary structure including a first set of light emitting diodes (LEDs) 18 on a surface of a temporary support substrate 16 that can be employed in accordance with an embodiment of the present application.

In one embodiment, the temporary support substrate 16 may be composed of a handler material such as, for example, glass or silicon. In another embodiment, the temporary support substrate 16 may be composed of an adhesive tape or polymeric film. In such an embodiment, the adhesive tape or polymeric film should have an adhesive strength that is less than the adhesive strength of the adhesive structures 14P. The temporary support substrate 16 may have a thickness from 500 microns to 1000 microns. Other thicknesses that are lesser than, or greater than, the aforementioned thickness values may also be used as the thickness of the temporary support substrate 16.

Each LED 18 of the first set of LEDs that is located on the temporary support substrate 16 is a micro-LED (i.e., a LED chiplet; the term "chiplet" is used throughout the present application to denote a LED that has been selected from a larger structure). Each LED 18 of the first set of LEDs emits a first color (i.e., one of red, blue or green).

Each LED 18 of the first set of LEDs includes a first semiconductor material of a first conductivity type and a second semiconductor material of a second conductivity type that is opposite from the first conductivity type (in this embodiment, the specific semiconductor material layers are not shown). In one embodiment, the first semiconductor material is located directly above or directly below the second semiconductor material. In another embodiment, the first semiconductor material is located laterally adjacent and in direct contact with the second semiconductor material. The LEDs 18 also include contact structures (not separately shown) composed of an ohmic metal or metal alloy that contact the various semiconductor materials that provide the LEDs 18.

The first and second semiconductor materials of the LED 18 include any semiconductor material or combination of semiconductor materials that when a suitable voltage is applied thereto, electrons are able to recombine with electron holes, releasing energy in the form of photons. The term "semiconductor material" is used throughout the present application to denote a material that exhibits semiconducting properties. Depending on the energy band gap of the first and second semiconductor materials, various colors such as, for example, red, blue or green, can be subsequently emitted therefrom. In one embodiment, the first and second semiconductor materials of the LED 18 are both composed of a III-V semiconductor compound material such as for example, GaN or GaAs.

In one embodiment, the first conductivity type is p-type and the second conductivity type is n-type. In another embodiment, the first conductivity type is n-type and the second conductivity type is p-type. The term "p-type" refers to the addition of impurities to an intrinsic semiconductor material that creates deficiencies of valence electrons. "N-type" refers to the addition of impurities that contributes free electrons to an intrinsic semiconductor. The concentration of dopants that provide the first and second conductivity types may be from $1\times10^{18}$ atoms/cm$^3$ to $5\times10^{21}$ atoms/cm$^3$; other dopant concentrations as possible so long as a p-n junction is provided between the first and second semiconductor materials that provide the LED.

The LEDs 18 can be formed utilizing any well known process. In one embodiment, the LEDs 18 may be formed utilizing a spalling (i.e., a material removal process). Spalling is a useful technique in creating thin film devices by fracturing a surface of a crystalline substrate through use of stress created by differences in material properties of the material to be fractured and a stressor material. In embodiments in which spalling is employed, a base semiconductor substrate containing at least one material that provides the LED 18 is first provided: other device components may be formed upon the base semiconductor substrate. Next, a stressor layer such as a layer of nickel is formed on top of the base semiconductor substrate, wherein the stressor layer is deposited to a thickness sufficient to permit mechanically-assisted spalling of the base semiconductor substrate. A handle layer such as an adhesive tape is then formed on stressor layer and thereafter a spalled structure including a portion of the base semiconductor substrate is removed from the original base semiconductor substrate by pulling the handle layer away from the base semiconductor substrate.

Each LED 18 may have any shape and dimension. In one example, each LED 18 has a length from 3000 nm to 100,000 nm, a width from 3000 nm to 100,000 nm and a height from 3000 nm to 100,000 nm. Other lengths, widths and heights are also contemplated and thus the present application is not limited to using the aforementioned lengths, widths and heights.

Each LED 18 can be mounted to the temporary support substrate 16 utilizing any conventional mounting process such as, for example, thermal compression wafer bonding.

Figure 5:
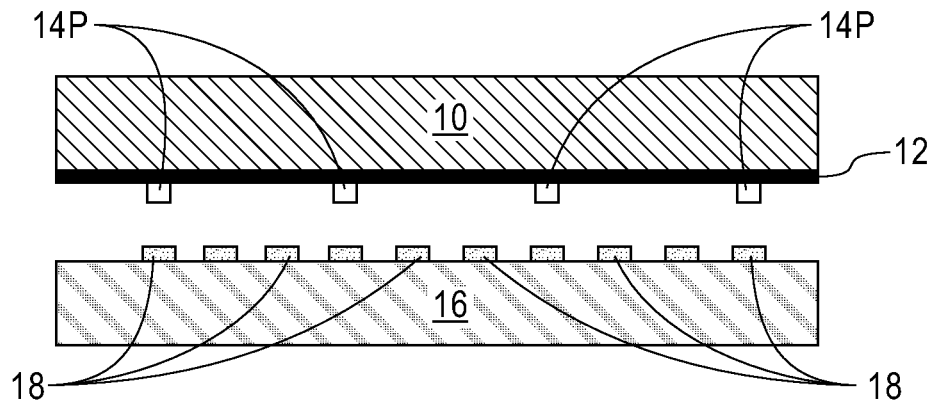
FIG. 5 is a cross sectional view of the first and second exemplary structures shown in FIGS. 3 and 4 after positioning the first exemplary structure of FIG. 3 in proximity to the second exemplary structure of FIG. 4.

Next, and as is shown in FIG. 5, the first exemplary structure of FIG. 3 is positioned in proximity to the second exemplary structure of FIG. 4. In the illustrated embodiment, the first exemplary structure of FIG. 3 is positioned above the second exemplary structure of FIG. 4. In other embodiments, the first exemplary structure of FIG. 3 may be positioned beneath the second exemplary structure of FIG. 4. In either embodiment, the positioning is such that the surface of the first exemplary structure of FIG. 3 containing the adhesive structures 14P is facing the surface of the second exemplary structure of FIG. 4 including the LEDs 18. As is shown, the positioning is such that each adhesive structure 14P of the first exemplary structure is aligned over a single LED 18 of the second exemplary structure. The positioning may be performed by hand or by any mechanical means such as, for example, a robot arm.

Figure 6:
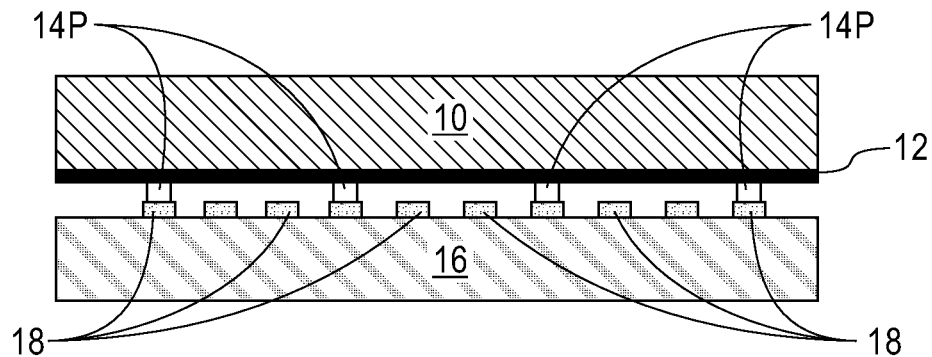
FIG. 6 is a cross sectional view of the first and second exemplary structures shown in FIG. 5 after bringing the first exemplary structure in physical contact with the second exemplary structure such that each adhesive structure contacts, and adheres to, one of the LEDs of the first set of LEDs.

Referring now to FIG. 6, there is illustrated the first and second exemplary structures shown in FIG. 5 after bringing the first exemplary structure in physical contact with the second exemplary structure such that each adhesive structure 14P contacts, and adheres to, one of the LEDs 18 of the first set of LEDs. The contacting may be performed by hand or by any mechanical means such as, for example, a robot arm. The contacting is typically, but not necessarily always, performed in the presence of an external force to ensure complete adhesive between the adhesive structures 14P and the LEDs 18. The external force may be provided above or below the contacted structures shown in FIG. 6.

Figure 7:
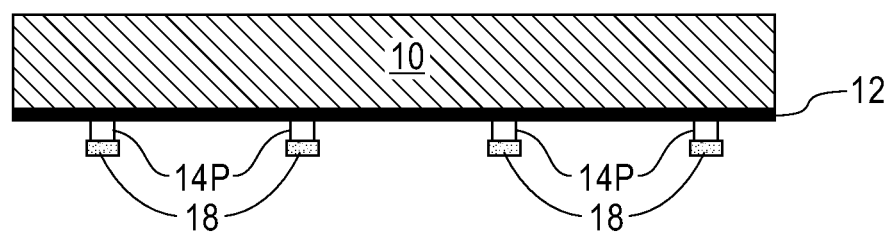
FIG. 7 is a cross sectional view of the two exemplary structures shown in FIG. 6 after removing the first exemplary structure containing LEDs of the first set of LEDs adhered to the adhesive structures from the second exemplary structure.

Referring now to FIG. 7, there is illustrated the two exemplary structures shown in FIG. 6 after removing the first exemplary structure containing LEDs 18 of the first set of LEDs adhered to the adhesive structures 14P from the second exemplary structure. The removal of the first exemplary structure containing LEDs 18 of the first set of LEDs adhered to the adhesive structures 14P from the second exemplary structure may be performed by hand or by mechanical means such as, for example, a robot arm, and includes pulling apart the two structures. At this point of the present application, the LEDs 18 of the first set of LEDs 18 are adhered to (and thus transferred to) the release layer 12 that is present on the handler substrate 10, and are ready to be transferred to a display substrate.

Figure 8:
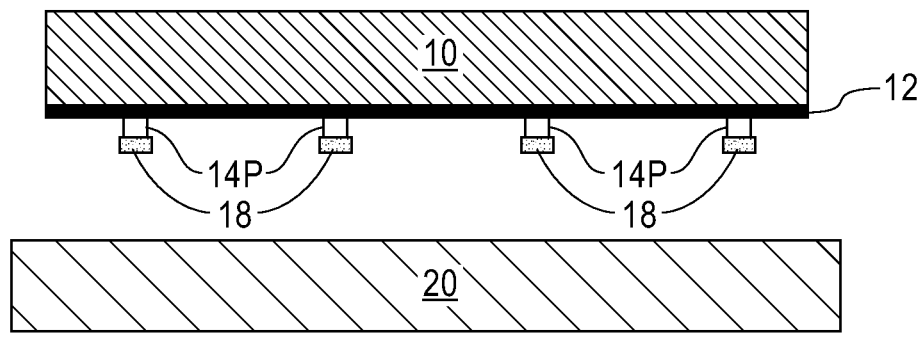
FIG. 8 is a cross sectional view after positioning the first exemplary structure containing LEDs of the first set of LEDs adhered to the adhesive structure shown in FIG. 7 in proximity to a display substrate.

Next, and as shown in FIG. 8, the first exemplary structure of FIG. 7 containing LEDs 18 of the first set of LEDs adhered to the adhesive structure 14P is positioned in proximity to a display substrate 20. The positioning may be performed by hand or by any mechanical means such as, for example, a robot arm.

In the illustrated embodiment, the first exemplary structure of FIG. 7 is positioned above the display substrate 20. In other embodiments, the first exemplary structure of FIG. 7 may be positioned beneath the display substrate 20. In either embodiment, the positioning is such that the physically exposed surface of each LED 18 is facing a surface of the display substrate 20.

The display substrate 20 typically has bond pads (not shown) located in areas in which LEDs 18 are to be subsequently transferred to. Bond pads can be composed of a metal or metal alloy such as, for example, titanium, gold, copper, tungsten, palladium, platinum and alloys thereof, and can be formed by depositing the metal or metal alloy and thereafter patterning the deposited metal or metal alloy. Patterning may be performed by lithography and etching as is well known to those skilled in the art. The bond pads may include a solder material which can provide a permanent bond between the transferred LEDs 18 and the bond pads. Examples of solder materials include, for example indium, bismuth, gold, silver, tin or alloys thereof. The solder material can be formed utilizing conventional techniques that are well known to those skilled in the art on a surface of each bond pad prior to subsequent bonding of LEDs 18 to the bond pads. In some embodiments, a solder material may be formed on the LEDs 18 prior to bonding. In yet another embodiment, solder material can be formed on both the bond pads and LEDs 18 prior to bonding. During a subsequently performed anneal, the solder material forms a soldered joint, i.e., permanent bond, between the LEDs 18 and the bond pads that are present on the display substrate 20.

The display substrate 20 (which may also be referred to as a receiving substrate) may include various materials such as, for example, a semiconductor material, an insulator or any combination thereof. When a semiconductor material is employed as the display substrate 20, the semiconductor material that provides the display substrate 20 includes, but is not limited to, silicon (Si), germanium (Ge), silicon germanium alloys (SiGe), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

When a semiconductor material is employed as the display substrate 20, the semiconductor material may be a single material or a combination of semiconductor materials. In some embodiments, a semiconductor-on-insulator including a handle substrate, a buried oxide, and a top semiconductor material may be used as the display substrate 20.

The insulator material that may be employed as the display substrate 20 includes any electrical insulating material such as, for example, glass, a ceramic (such as a carbide, an oxide or a nitride), and/or a plastic. The insulator material that can provide the display substrate 20 may be composed of a single electrical insulating material or a combination of electrical insulating materials. In some embodiments, a material stack, in any order, of a semiconductor material and an insulator material may be employed as display substrate 20.

The display substrate 20 may have a thickness from few microns (e.g., 2 microns) to a few millimeters (e.g., 3 millimeters). Other thicknesses that are lesser than, or greater than, the aforementioned thickness values may be employed as the thickness of display substrate 20.

In one embodiment and as shown in FIG. 8, the display substrate 20 includes an entirely planar topmost surface in which the LEDs 18 will be subsequently transferred to. In other embodiments, the LEDs 18 can be transferred to an opening formed in the display substrate 20 or a mesa portion of the display substrate 20. The openings and mesa portions can be formed by patterning the display substrate 20. When such embodiments are employed, patterning may include lithography and etching.

Figure 9:
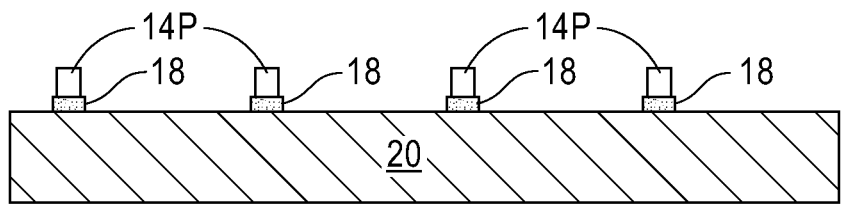
FIG. 9 is a cross sectional view of the two exemplary structures shown FIG. 8 after transferring the LEDs of the first set of LEDs to the display substrate.

Next, and as shown in FIG. 9, the LEDs 18 of the first set of LEDs are transferred from the handler substrate 10 to the display substrate 20. The transferring of the LEDs 18 includes bringing the two exemplary structures shown in FIG. 8 into intimate contact with each such that a physically exposed surface of the LED 18 contacts a surface (e.g., a bond pad) of the display substrate 20. The physical contacting may be performed by hand or by mechanical means such as a robot arm. The physical contacting is such that a physical exposed surface of the LEDs is in contact with a surface (i.e., bond pads) of the display substrate 20. An external force may or may not be applied during the contacting. After contacting, each LED 18 and its corresponding adhesive structure 14P are released from the hander substrate 10 by performing a release process which removes the release layer 12 from the structure. In one embodiment, and when the release layer 12 is composed of a laser ablatable material, laser ablation can be used to remove the release layer 12 from the handler substrate 10 and thus transfer the LEDs 18 to the display substrate 20. In another embodiment, and when the release layer 12 is composed of a dissolvable material, a chemical etchant can be used to selectively remove the release layer 12 from the structure. The adhesive structures 14P may be removed utilizing a conventional material removal process such as, for example, planarization or by utilizing a chemical etchant that is selective in removing each adhesive structure 14P. The adhesive structures 14P may be removed any time after the transfer process has been completed.

In some embodiments, an anneal may be performed to form a permanent bond between the surface (bond pads) of the display substrate 20 and each LED 18. The anneal may form a solder joint as mentioned above. The anneal (i.e., bonding anneal) may be performed at a temperature from 100° C. to 1000° C., depending on the annealing time. Typically higher temperature requires less annealing time. Annealing can be done by rapid thermal anneal (RTP), laser anneal, flash anneal, furnace anneal, or any suitable combination of those techniques. In one embodiment, the anneal is performed at 400° C. for 30 seconds. Other temperatures may also be used as long as the anneal temperature is capable of forming a permanent bond. In some embodiments, the anneal may be performed in an inert ambient such as, for example, helium and/or argon. In other embodiments, the anneal may be performed in a forming gas ambient. The duration of the anneal may vary so long as the duration of the anneal causes the formation of a permanent bond between each transferred LED 18 and the contact surface of the display substrate 20.

Figure 10:
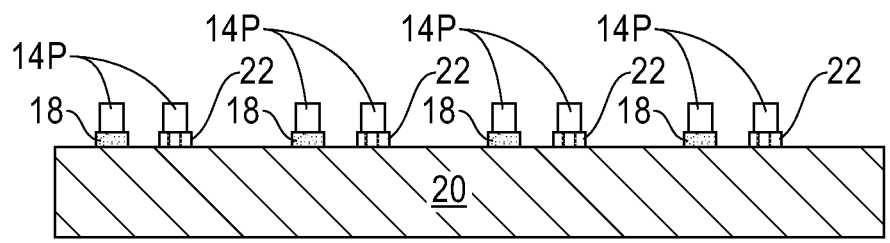
FIG. 10 is a cross sectional view of the display substrate of FIG. 9 after transferring a second set of LEDs that emit a different color than the first set of LEDs to the display substrate by repeating the processing steps illustrated in FIGS. 1-9, with an offset.

Referring now to FIG. 10, there is illustrated the display substrate 20 of FIG. 9 after transferring a second set of LEDs 22 to the display substrate 20 by repeating the processing steps illustrated in FIGS. 1-9, with an offset such that each LED 22 of the second set of LEDs is not formed in contact with LEDs 18 of the first set of LEDs. Each LED 22 of the second set of LEDs emits a second color that differs from the color that each LED 18 of the first set of LEDs emits.

Figure 11:
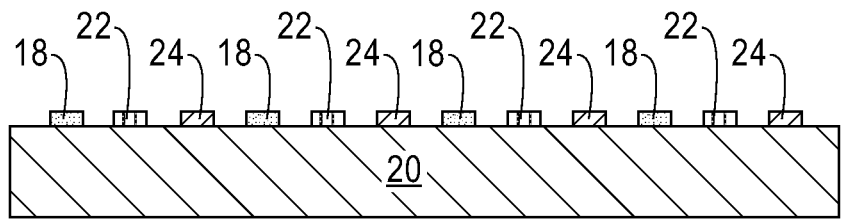
FIG. 11 is a cross sectional view of the display substrate of FIG. 10 after transferring a third set of LEDs that emit a different color than both the first and second sets of LEDs to the display substrate by repeating the processing steps illustrated in FIGS. 1-9, with another offset.

Referring now to FIG. 11, there is illustrated the display substrate 20 of FIG. 10 after transferring a third set of LEDs 24 to the display substrate 20 by repeating the processing steps illustrated in FIGS. 1-9, with another offset such that each LED 24 of the third set of LEDs is not formed in contact with any of LEDs 18 and LEDs 22. Each LED 24 of the third set of LEDs emits a third color that differs from the color emitted by each LEDs 18 and a color emitted by each LED 22.

Reference is now made to FIGS. 12-17 which illustrates a second method of the present application in which microLEDs (i.e., LED chiplets) of various colors (e.g., red, blue and green) can be transferred to a display substrate by utilizing a photo-patternable polymer and a release layer. In this embodiment of the present application, a structure is provided that includes a first set of LEDs that emit a first color which are located on a temporary support substrate. An adhesive structure composed of a photo-patterned adhesive is formed on a preselected number of the LEDs of the first set of LEDs, some of LEDs of the first set of LEDs do not necessarily include the adhesive structure. This structure is then brought into contact with a structure containing a release layer located on a surface of a handler substrate such that each adhesive structure and an adhered LED of the first set of LEDs is transferred to the release layer present on the handler substrate. This structure is then brought into contact with a display substrate and thereafter the LEDs and the adhesive structures are transferred to the display substrate utilizing a release process such as, for example laser ablation or contact with an etchant, to transfer each of the LEDs and the adhesive structures to the display substrate. This processing can be repeated at least twice to transfer a second set of LEDs that emit a second color and a third set of LEDs that emit a third color to the display substrate. In the present application, the first color is different from the second color, and the third color is different from both the first and third colors.

Figure 12:
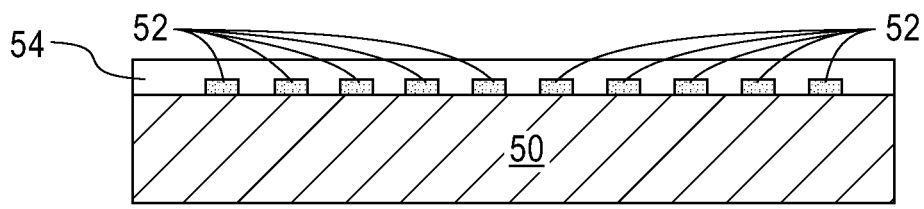
FIG. 12 is a cross sectional view of a third exemplary structure including a first set of light emitting diodes (LEDs) on a surface of a temporary support substrate, wherein a photo-patternable adhesive layer laterally surrounds and is present above each LED of the first set of LEDs that can be employed in accordance with an embodiment of the present application.

Referring first to FIG. 12, there is illustrated a third exemplary structure that can be employed in the second method of the present application. The third exemplary structure of FIG. 12 includes a first set of light emitting diodes (LEDs) 52 on a surface of a temporary support substrate 50, wherein a photo-patternable adhesive layer 54 laterally surrounds and is present above each LED 52 of the first set of LEDs.

The temporary support substrate 50 of this method of the present application may include one of the materials mentioned above for temporary support substrate 16. The temporary support substrate 50 may have a thickness within the thickness range mentioned above for temporary support substrate 16.

LEDs 52 of the first set of LEDs are micro-LEDs and include materials as mentioned above for LEDs 18. LEDs 52 of the first set of LEDs can be formed utilizing the techniques mentioned above for forming LEDs 18. Each LED 52 of the first set of LEDs emits a first color (i.e., one of red, blue or green).

The photo-patternable adhesive layer 54 that is employed in the second method may include one of the photo-patternable materials mentioned above for photo-patternable adhesive layer 14. The photo-patternable adhesive layer 54 can be formed utilizing one of the deposition processes mentioned above for photo-patternable adhesive layer 14. The photo-patternable adhesive layer 54 has a thickness which is sufficient to cover the topmost surface of each LED 52 of the first set of LEDs. In one embodiment, the thickness of the photo-patternable adhesive layer 54 can be from 5,000 nm to 20,000 nm.

Figure 13:
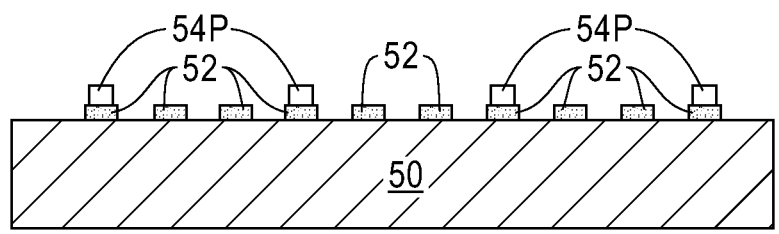
FIG. 13 is a cross sectional view of the third exemplary structure of FIG. 12 after patterning the photo-patternable adhesive layer to provide a plurality of adhesive structures located on a preselected number of LEDs of the first set of LEDs.

Referring now to FIG. 13, there is illustrated the third exemplary structure of FIG. 12 after patterning the photo-patternable adhesive layer 54 to provide a plurality of adhesive structures 54P located on a preselected number of LEDs 52 of the first set of LEDs. While the present embodiment describes and illustrates an embodiment in which the adhesive structures are formed only on some of the LEDs 52, it is within the scope of the present application to form an adhesive structure 54P on each of the LEDs 52 of the first set of LEDs.

Each adhesive structure 54P is composed of a remaining portion of the photo-patternable adhesive layer 54 (i.e., a photo-patterned adhesive). The patterning of the photo-patternable adhesive layer 54 may be performed by exposing the photo-patternable adhesive layer 54 to a desired pattern of radiation, and developing the exposed photo-patternable adhesive layer 54 utilizing a conventional resist developer. No separate photoresist material or a pattern transfer etch is required to pattern the photo-patternable adhesive layer 54.

Each adhesive structure 54P that is formed is spaced apart from a neighboring adhesive structure 54P. Thus, there is no direct physical contact between the various adhesive structures 54P. Each adhesive structure 54P is designed to have a shape and dimension of LED 52. As such, the sidewalls of each adhesive structure 54P are vertically aligned with the sidewalls one of the LEDs 52.

Figure 14:
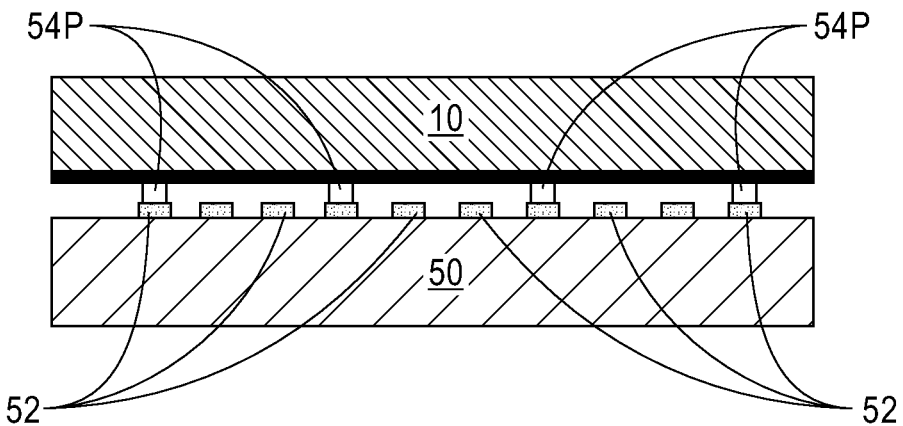
FIG. 14 is a cross sectional view after bringing the first exemplary structure of FIG. 1 in physically contact with the third exemplary structure shown in FIG. 13 such that each adhesive structure contacts, and adheres to, the release layer.

Next, and as shown in FIG. 14, the first exemplary structure of FIG. 1 is brought in physically contact with the third exemplary structure shown in FIG. 13 such that each adhesive structure 54P contacts, and adheres to, the release layer 12 The physical contacting may be performed by hand or by mechanical means such as a robot arm. The physical contacting is such that a physical exposed surface of each adhesive structure 54P is in contact with a surface of the release layer 12. In some embodiments, an external force may be applied during the contacting to facilitate the adhesive of the adhesive structures 54P and the release layer 12. In accordance with the present application, the adhesive force between the adhesive structures 54P and the release layer 12 is greater than the force that holds the LEDs 52 on the surface of the temporary support substrate 50.

Figure 15:
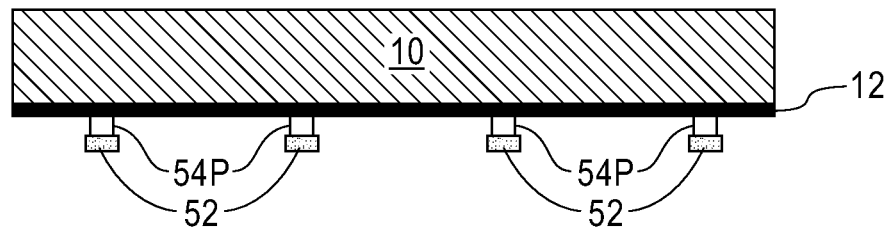
FIG. 15 is a cross sectional view of the exemplary structures shown in FIG. 14 after removing the first exemplary structure containing the adhered LEDs located on the release layer from the third exemplary structure.

Referring now to FIG. 15, there is illustrated the structure of FIG. 14 after removing the first exemplary structure containing the adhered LEDs (52/54P) located on the release layer 12 from the temporary support substrate 50 of the third exemplary structure. The removal of the first exemplary structure containing the adhered LEDs (52/54P) located on the release layer 12 can be performed by pulling apart the two structures. The pulling apart may be performed by hand or by mechanical means.

Figure 16:
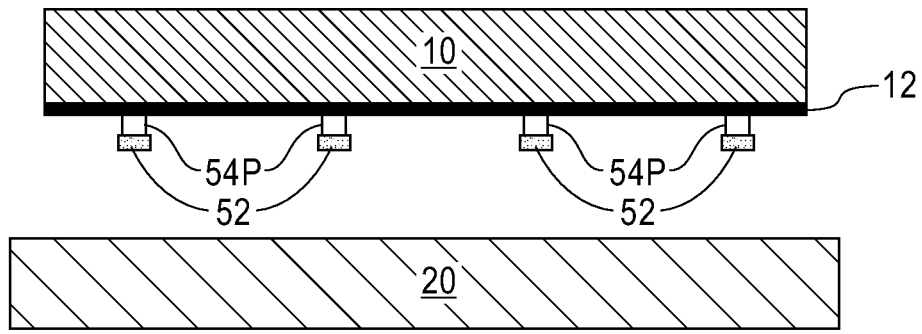
FIG. 16 is a cross sectional view after positioning the first exemplary structure of FIG. 15 containing the adhered LEDs located on the release layer in proximity to a display substrate.

Next, and as shown in FIG. 16, the first exemplary structure of FIG. 15 containing the adhered LEDs (52/54P) located on the release layer 12 is brought in proximity to a display substrate 20. Display substrate 20 of this embodiment is the same as display mentioned in the previous embodiment of the present application. Display substrate 20 may include bond pads (with or without a solder material) located on a surface thereof. The bringing of the two structures in proximity to each other may be performed by hand or by the use of mechanical means such as, for example, a robot arm. The two structures shown in FIG. 16 may be oriented in any order so long as a physically exposed surface of the LED 52 of the first set of LEDs faces a surface of the display substrate 20.

Figure 17:
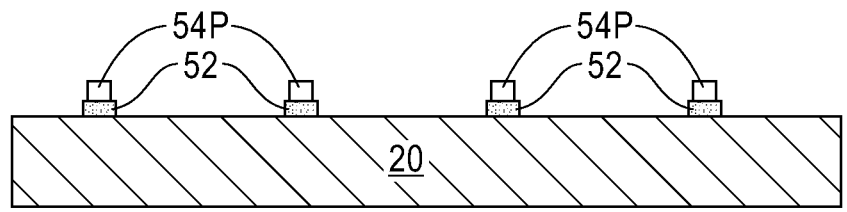
FIG. 17 is a cross sectional view of FIG. 16 after transferring the LEDs of the first set of LEDs to the display substrate.

Next, and as shown in FIG. 17, the LEDs 52 of the first set LEDs together with the adhesive structures 54 are transferred to the display substrate 20. The transferring of LEDs 52 includes bringing the two exemplary structures shown in FIG. 16 into intimate contact with each such that a physically exposed surface of the LED 52 contacts a surface of the display substrate 20. The physical contacting may be performed by hand or by mechanical means such as a robot arm. The physical contacting is such that a physical exposed surface of the LEDs 52 is in contact with a surface (i.e., bond pads) of the display substrate 20. An external force may or may not be applied during the contacting. After contacting, each LED 52 and its corresponding adhesive structure 54P is released from the hander substrate 10 by performing a release process such as, for example, laser ablation or contacting with an etchant, which removes the release layer 12 from the structure. The adhesive structures 54P may be removed utilizing a conventional material removal process such as, for example, planarization or etching.

In some embodiments, an anneal may be performed to form a permanent bond between the surface (bond pads) of the display substrate 20 and each LED 52. The anneal may form solder joint as mentioned above. The anneal employed in this embodiment may include conditions mentioned above in the annealing that can be used in the first method of the present application.

The above processing steps described and illustrated in FIGS. 12-17 may be repeated at least twice to transfer a second set of LEDs that emit a second color and a third set of LEDs that emit a third color to the display substrate 20 including the first set of LEDs 52. In this embodiment, the second color emitted by each of LED of the second set of LEDs is different from the color emitted by LEDs 52, and the color of each LED of the third set of LEDs is different from the color emitted by both LEDs 52 and each LED of the second set of LEDs. As in the case of the previous embodiment of the present application, the LEDs of the first, second and third sets of LEDs that are transferred to the display substrate 20 are not in physically contact with each other.

Reference is now made to FIGS. 18-32 in which LED chiplets are formed utilizing a spalling process. FIGS. 18-21 describe and illustrate a first spalling process in which LEDs chiplets are formed from a spalled material portion of a base semiconductor substrate, FIGS. 22-25 describe and illustrate a second spalling process in which pre-LEDs chiplets are formed on a base semiconductor substrate prior to spalling, FIGS. 26-28 describe and illustrate a third spalling process in which pre-LED chiplets and discrete metal stressor structures are formed over base semiconductor substrate prior to spalling, and FIGS. 29-32 describe and illustrate a fourth spalling process in which discrete metal stressor structures are formed over base semiconductor substrate prior to spalling and the spalled material portions are then employed in forming LEDs. The first and second spalling processes shown in FIGS. 11-25 are non-selective spalling processes, while the third and fourth spalling processes shown in FIGS. 26-32 are selective spalling processes.

Figure 18:
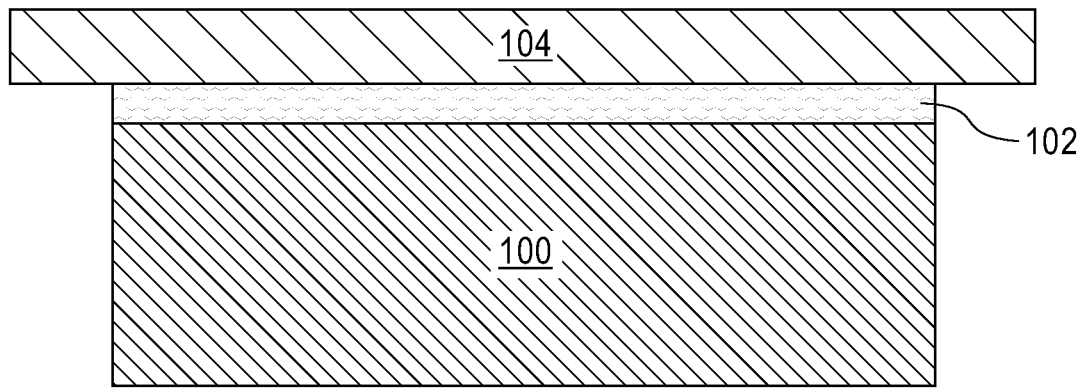
FIG. 18 is a cross sectional view of a fourth exemplary structure including a base semiconductor substrate, a metal stressor layer and a handle substrate that can be employed in another embodiment of the present application.

Referring first to FIG. 18, there is illustrated a fourth exemplary structure that can be employed in a first spalling process of the present application. The exemplary structure of FIG. 18 includes, from bottom to top, a base semiconductor substrate 100, a metal stressor layer 102 and a handle substrate 104. In the illustrated embodiment, the semiconductor material that provides the base semiconductor substrate 100 includes any semiconductor material that can be used in LED fabrication such as, for example, a III-V compound semiconductor material. In some embodiments, the base semiconductor substrate 100 may be composed of an intrinsic semiconductor material. In other embodiments, the base semiconductor substrate 100 may be of first conductivity type (i.e., it may contain an n-type or p-type dopant therein). The base semiconductor substrate 100 may have a thickness from 50 microns to 2 millimeters.

Next, the metal stressor layer 102 is formed on a surface of the base semiconductor substrate 100. In the illustrated embodiment, the metal stressor layer 102 is a continuous layer that is formed over the entirety of the base semiconductor substrate 100. The metal stressor layer 102 is composed of a metal or metal alloy that can introduced a stress into the base semiconductor substrate 100. Examples of materials that can be used as the metal stressor layer 102 include, for examples, nickel, cobalt, iron or alloys thereof. In one embodiment, the material that provides the metal stressor layer 102 is composed of nickel.

The metal stressor layer 102 can be formed utilizing a deposition process such as, for example, chemical vapor deposition, plasma enhanced chemical vapor deposition, physical vapor deposition, atomic layer deposition, sputtering or plating. The metal stressor layer 102 has a thickness that is sufficient to permit mechanically-assisted spalling of the underlying base semiconductor substrate 100. In one example, the metal stressor layer 102 may have a thickness from 1000 nm to 30000 nm.

Handle substrate 104 is then formed on a physically exposed surface of the metal stressor layer 102. The handle substrate 104 typically has a length that extends beyond the length of the underlying material stack of the base semiconductor substrate 100 and the metal stressor layer 102. The handle substrate 104 of this embodiment includes a releasable film such as, for example, a tape or an adhesive film. The handle substrate 104 is used to guide crack propagation in the base semiconductor substrate 100 induced by the metal stressor layer 102 during spalling. The handle substrate 104 can be formed on the physically exposed surface of the metal stressor layer 102 by hand or mechanical means.

Figure 19:
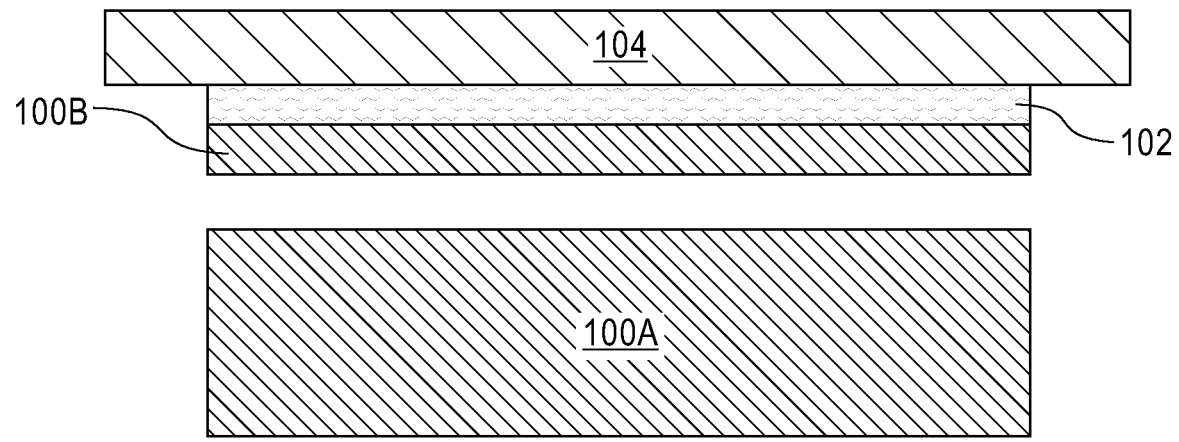
FIG. 19 is a cross sectional view of the fourth exemplary structure shown in FIG. 18 after spalling in which a spalled structure is provided.

Referring now to FIG. 19, there is illustrated the fourth exemplary structure shown in FIG. 18 after spalling in which a spalled structure (100B, 102, 104) is provided. As is shown, spalling removes an upper portion of the base semiconductor substrate 100. The removed upper portion of the base semiconductor substrate 100 is referred to herein as a spalled semiconductor material portion 100B; the remaining base semiconductor substrate 100 after spalling is referred to herein as a base semiconductor material portion 100A.

In one embodiment, spalling includes pulling or peeling the handle substrate 104 to remove the spalled structure (100B, 102, 104). Spalling includes crack formation and propagation within the base semiconductor substrate 100 induced by the metal stressor layer 102. In some embodiments, spalling may be initiated at substantially room temperature (i.e., 15° C. to 40° C.). In other embodiments, spalling can be performed at a temperature from 100° C. and below (it is possible to spall at temperatures below 0° C.). In some embodiments, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, and if not previously done, a dopant (n-type or p-type) can be introduced into the spalled semiconductor material portion 100B by utilizing any well known doping process such as, for example, gas phase doping or ion implantation. The doping of the spalled semiconductor material portion 100B may be performed after mounting the spalled structure (100B, 102, 104) to a temporary support substrate and removal of the handle substrate 104 therefrom.

Figure 20:
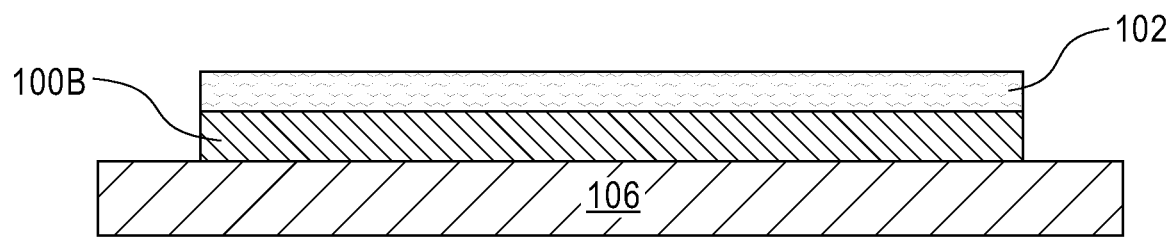
FIG. 20 is a cross sectional view of the spalled structure of FIG. 19 after mounting the spalled structure on a temporary support substrate and removing the handle substrate.

Referring now to FIG. 20, there is illustrated the spalled structure (100B, 102, 104) of FIG. 19 after mounting the spalled structure (100B, 102, 104) on a temporary support substrate 106 and removing the handle substrate 104. The removal of the handler substrate 104 may be performed prior to, or after mounting of the spalled structure (100B, 102, 104) on the temporary support substrate 106. The handle substrate 104 can be removed by hand or mechanical means so as to physically expose a surface of the metal stressor layer 102.

The physically exposed surface of the spalled semiconductor material portion 100B is then mounted to the temporary support substrate 106 by adhesion. If not previously done, doping of the spalled semiconductor material portion 100B can be performed after mounting to provide a first conductivity type dopant to the spalled semiconductor material portion 100B. In one embodiment, the temporary support substrate 106 may include a polymeric film that is laser ablatable. In another embodiment, the temporary support substrate 106 may be composed of a material that is dissolvable in a specific etchant.

Figure 21:
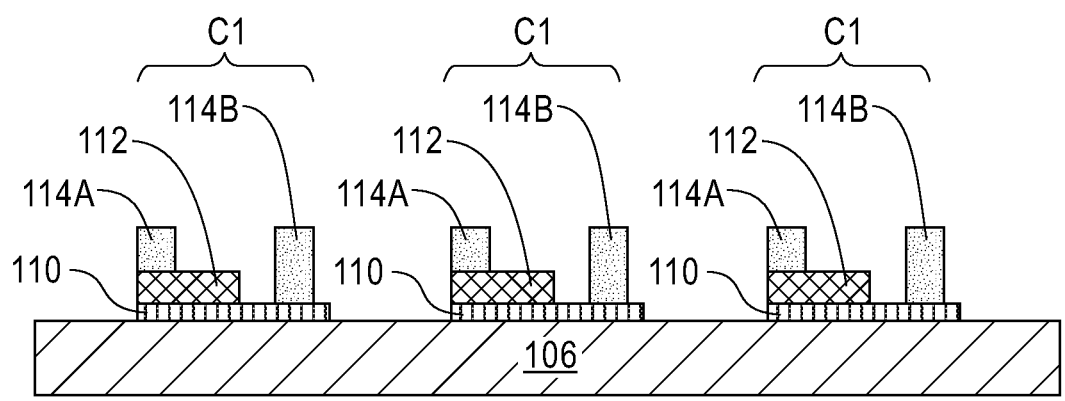
FIG. 21 is a cross sectional view of the structure shown in FIG. 20 after removing the metal stressor layer and LED processing.

Referring now to FIG. 21, there is illustrated the structure shown in FIG. 20 after removing the metal stressor layer 102 and LED processing. The metal stressor layer 102 may be removed utilizing a material removal process that is selective for removing a metal or metal alloy that provides the metal stressor layer 102.

The LED processing forms LED chiplets, C1, of a first set of LED chiplets that emit a first color on the temporary support substrate 106. Each LED chiplet, C1, includes a first semiconductor material layer 110 of a first conductivity type, a second semiconductor material layer 112 of a second conductivity type that is opposite from the first conductivity type, and top contact structures 114A and 114B. As is shown, top contact structure 114A is in direct contact with a topmost surface of the second semiconductor material layer 112, while the second top contact structure 114B is in direct contact with a topmost surface of the first semiconductor material layer 110.

Each LED chiplet, C1, of the first set of LED chiplets can be formed by first introducing a dopant into an upper portion of the spalled semiconductor material portion 100B such that the upper portion of the spalled semiconductor material portion has an opposite conductivity (i.e., second conductivity) than the first conductivity of the lower portion of the spalled semiconductor material portion 100B; the upper portion of the spalled semiconductor material portion 100B is used in providing the second semiconductor material layer 112 of each chiplet C1, while the lower portion of the spalled semiconductor material portion 100B is used in providing the first semiconductor material layer 110 of each chiplet C1. A p-n junction exists between the first and second semiconductor material layers (110, 112). The material stack of the first and second semiconductor materials having the opposite conductivity type are then patterned to form the first and second semiconductor material layers (100, 112). Patterning may be achieved by lithography and etching.

Top contact structures 114A, 114B are then formed. The top contact structures 114A, 114B may include any ohmic metal or metal alloy. Examples of ohmic metals or metal alloys that may be employed as the top contact structures include nickel, gold, silver, cobalt, aluminum, titanium, tungsten, palladium, platinum, or nickel silver. The top contact structures 114A, 114B can be formed by deposition of a blanket layer of an ohmic metal or metal alloy, followed patterning the blanket layer of ohmic metal or metal alloy. In one embodiment, patterning may be performed by lithography and etching. The top contact structures 114A, 114B have topmost surfaces that are typically coplanar with each other.

Preselected chiplets, C1, shown in FIG. 21 can then be transferred to a display substrate by releasing the preselected chiplets, C1, from the temporary support substrate 106. The release may include laser ablation or any other technique that is capable of releasing the preselected chiplets, C1, from the temporary support substrate 106. The processing described in FIGS. 18-21 may be repeated at least two more times to form a second set of LED chiplets and a third set of LED chiplets on the display substrate. As in the previous embodiments, the first chiplets emit a first color, the second chiplets emit a second color that differs from the first color, and the third chiplets introduce a third color that is different from both the first and second colors.

Figure 22:
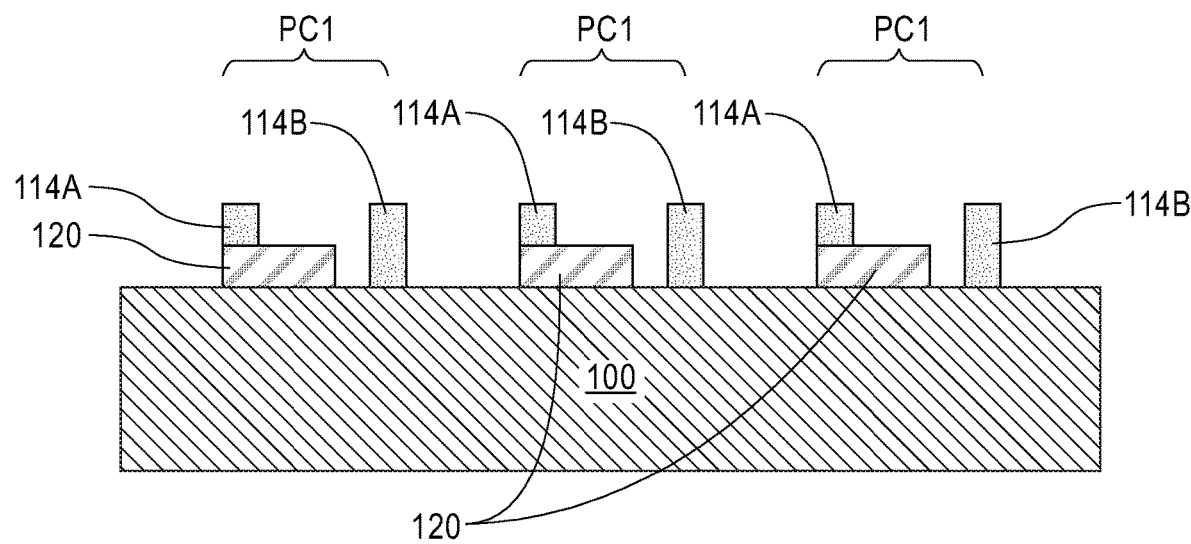
FIG. 22 is a cross sectional view of a fifth exemplary structure including a plurality of pre-LED chiplets located on a surface of a base semiconductor substrate.

Referring now to FIG. 22, there is illustrated a fifth exemplary structure that can be employed in the present application. The exemplary structure of FIG. 22 includes a plurality of pre-LED chiplets, PC1, located on a surface of a base semiconductor substrate 100. The base semiconductor substrate 100 of this embodiment is the same as base semiconductor substrate 100 mentioned in the previous embodiment of the present application. Each pre-chiplet, PC1, includes a semiconductor layer 120 of a second semiconductor material having a second conductivity that is opposite the first conductivity type. The second semiconductor material that provides semiconductor layer 120 may be the same as, or different from, the semiconductor material that provides the base semiconductor substrate 100 provided that the second semiconductor material of the semiconductor layer 120 can be used as a component of an LED.

The semiconductor layer 120 of each pre-chiplet, PC1, can be formed by epitaxially growing a blanket layer of the second semiconductor material on the base semiconductor substrate 100 via an epitaxial growth or deposition process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 1100° C. Although higher temperature typically results in faster deposition, the faster deposition may result in crystal defects and film cracking. The epitaxial growth of the blanket layer of second semiconductor material can be performed utilizing any well known precursor gas or gas mixture. Carrier gases like hydrogen, nitrogen, helium and argon can be used. A dopant that provides a second conductivity type to the second semiconductor material may be added during the epitaxial growth process or after epitaxial growth of the second semiconductor material via gas phase doping or ion implantation.

After providing the blanket layer of the second semiconductor material, the blanket layer of the second semiconductor material is then patterned to form a plurality of semiconductor layers 120 on different portions of the base semiconductor substrate 100.

After providing the semiconductor layers 120, top contact structures 114A, 114B are formed. Top contact structures 114A, 114B of this embodiment are the same as top contacts formed in the previous embodiment of the present application. Top contact structure 114A contacts a topmost surface of each semiconductor layer 120, while top contact structure 114B contacts a topmost surface of the base semiconductor substrate 100.

Figure 23:
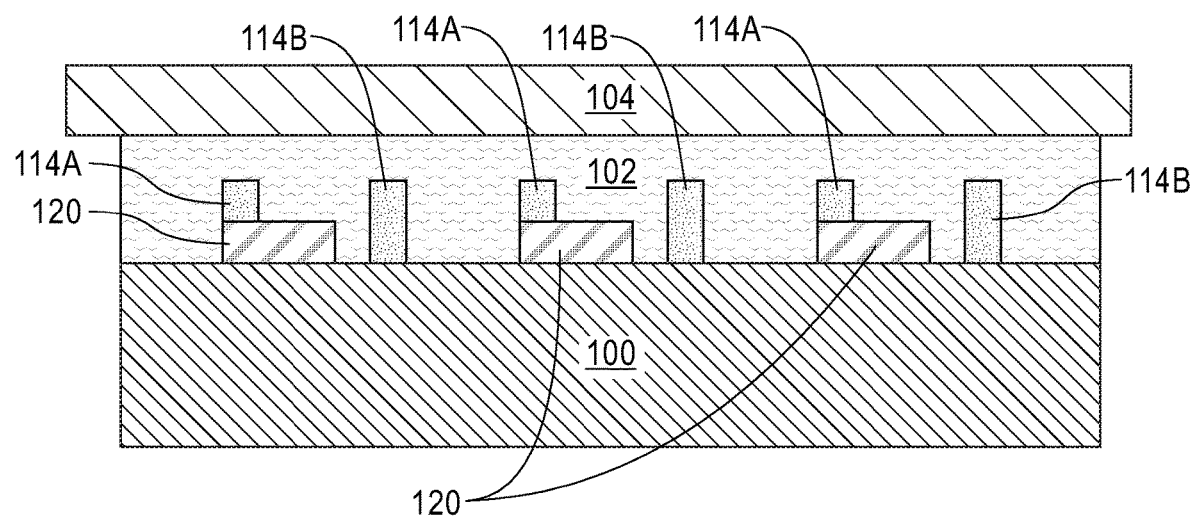
FIG. 23 is a cross sectional view of the fifth exemplary structure of FIG. 22 after forming a metal stressor layer laterally surrounding and located above each pre-LED chiplet and forming a handle substrate on the metal stressor layer.

Referring now to FIG. 23, there is illustrated the fifth exemplary structure of FIG. 22 after forming a metal stressor layer 102 laterally surrounding and located above each pre-LED chiplet, PC1, and forming a handle substrate 104 on the metal stressor layer 102. The metal stressor layer 102 and the handle substrate 104 of this embodiment of the present application are the same as the previous embodiment of the present application.

Figure 24:
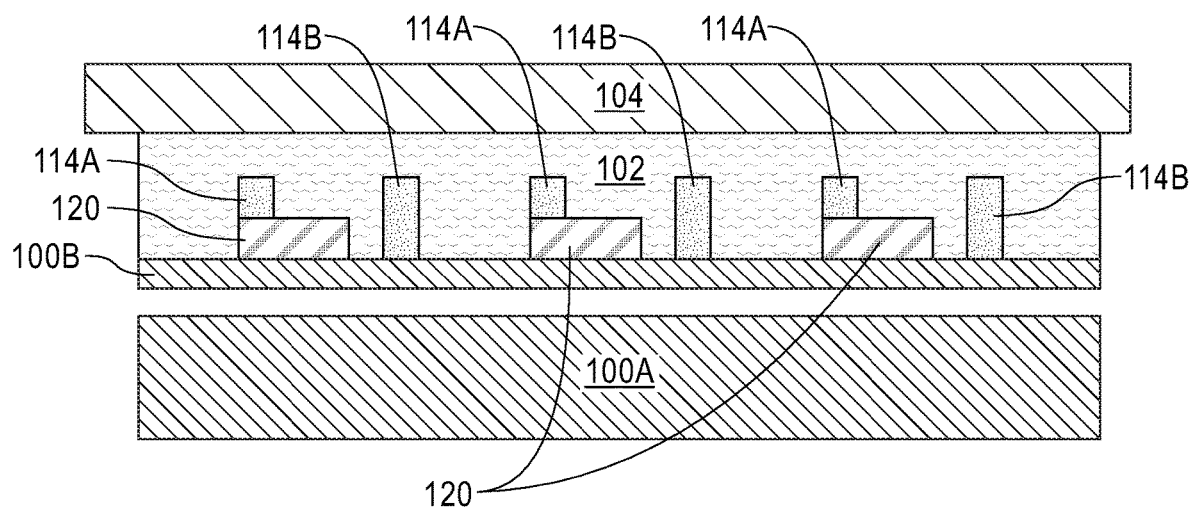
FIG. 24 is a cross sectional view of the fifth exemplary structure shown in FIG. 23 after spalling in which a spalled structure is provided.

Referring now to FIG. 24, there is illustrated the fifth exemplary structure shown in FIG. 23 after spalling in which a spalled structure (100B, PC1, 102, 104) is provided. Spalling may be performed as in the previous embodiment of the present application. After spalling and if not done previously, a dopant of the first conductivity type can be introduced into the spalled semiconductor material portion 100B of the spalled structure.

Figure 25:
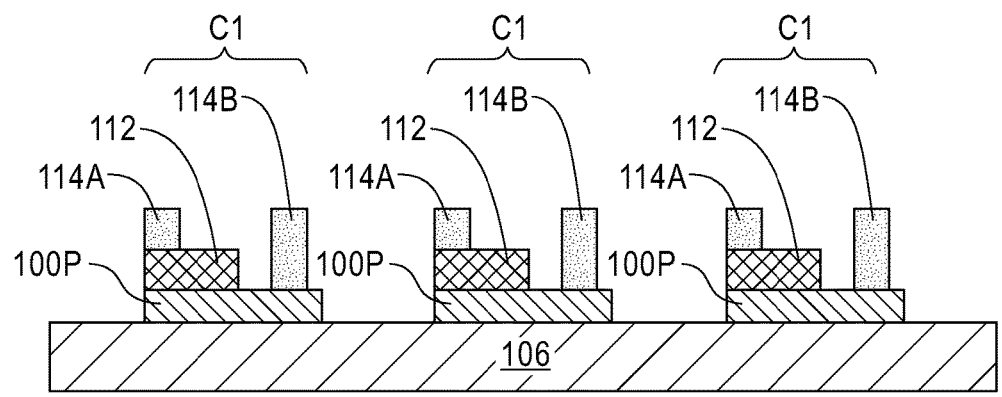
FIG. 25 is a cross sectional view of the spalled structure of FIG. 24 after mounting the spalled structure on a temporary support substrate, and removing the handle substrate and the metal stressor layer.

Referring now to FIG. 25, there is illustrated the spalled structure (100B, PC1, 102, 104) of FIG. 24 after mounting the spalled structure (100B, PC1, 102, 104) onto a temporary support substrate 106, and removing the handle substrate 104 and the metal stressor layer 102. The handle substrate 104 can be removed prior to or after mounting. The handle substrate 104 of this embodiment may be removed as described in the first spalling process of the present application. The mounting of the spalled structure may be performed utilizing the technique mentioned in the first spalling process. The temporary support substrate 106 used in this embodiment is the same as the temporary support substrate 106 used in the first spalling process mentioned above. The metal stressor layer 102 may be removed utilizing any conventional material removal process.

After mounting and removing the handle substrate 104 and the metal stressor layer 102, the spalled semiconductor material portion 100B of the first conductivity type is patterned to form a bottom semiconductor material layer 100P of a LED chiplet, C1. Each LED chiplet includes the bottom semiconductor layer 100P (of the first conductivity type), the semiconductor layer 120 (of a second conductivity type), and top contacts 114A, 114B.

Preselected chiplets, C1, shown in FIG. 25 can then be transferred to a display substrate by releasing the preselected chiplets, C1, from the temporary support substrate 106. The release may include laser ablation or any other technique that is capable of releasing the preselected chiplets, C1, from the temporary support substrate 106. The processing described in FIGS. 22-25 may be repeated at least two more times to form a second set of LED chiplets and a third set of LED chiplets on the display substrate. As in the previous embodiments, the first chiplets emit a first color, the second chiplets emit a second color that differs from the first color, and the third chiplets introduce a third color that is different from both the first and second colors.

Figure 26:
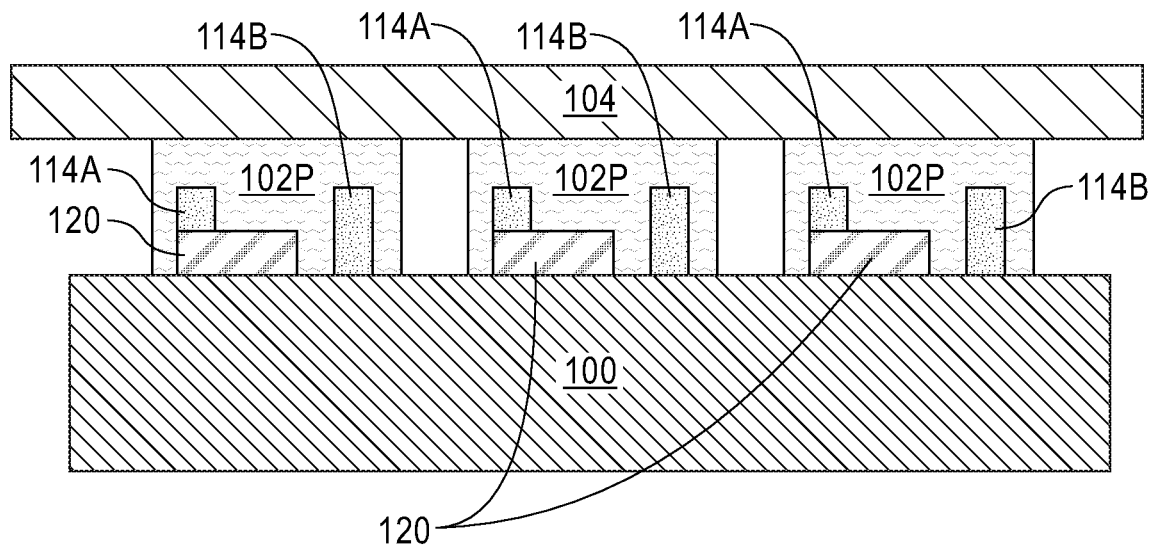
FIG. 26 is a cross sectional view of the fifth exemplary structure of FIG. 22 after forming discrete metal stressor structures, each discrete metal stressor structure laterally surrounds and is located above one of the pre-LED chiplets, and forming a handle substrate above each discrete metal stressor structure.

Referring now to FIG. 26, there is illustrated a cross sectional view of the fifth exemplary structure of FIG. 22 after forming discrete metal stressor structures 102P, each discrete metal stressor structure 102P laterally surrounds and is located above one of the pre-LED chiplets, PC1, and forming a handle substrate 104 above each discrete metal stressor structure 102P. The discrete metal stressor structures 102P are formed by first forming a blanket layer of a metal stressor material and thereafter the blanket layer of metal stressor material is patterned. Patterning may be performed by lithography and etching. The metal stressor material that provides the blanket layer includes one of the stressor materials mentioned above for metal stressor layer 102. The blanket layer of metal stressor material may be formed utilizing one of the deposition processes mentioned above for forming metal stressor layer 102. The handle substrate 104 employed in this embodiment is the same as that described above in the first spalling process.

Figure 27:
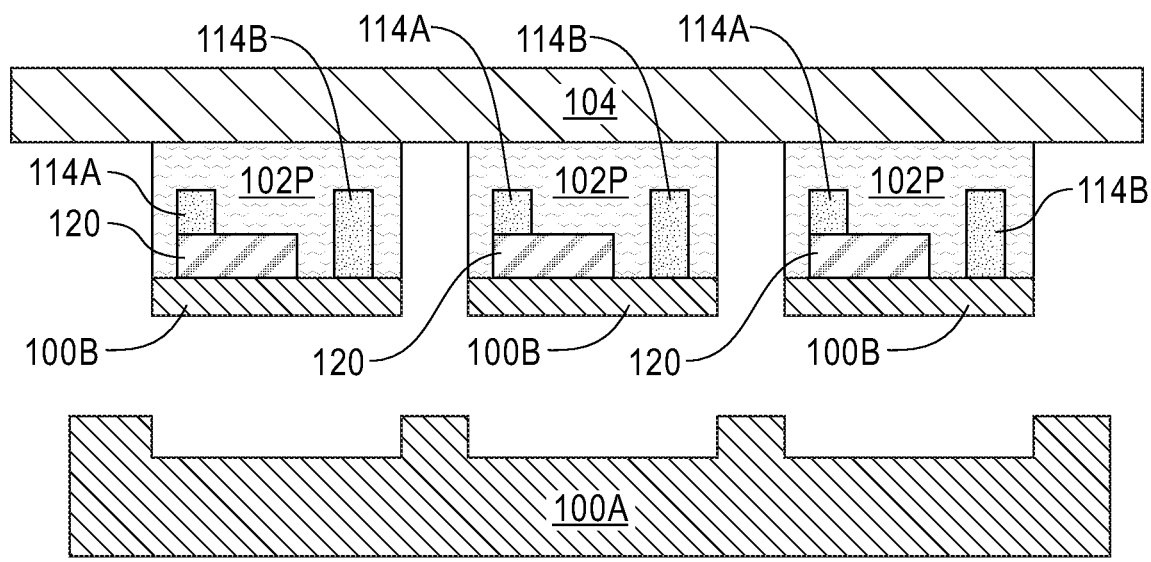
FIG. 27 is a cross sectional view of the fifth exemplary structure of FIG. 26 after spalling in which a spalled structure is provided.

Referring now to FIG. 27, there is illustrated the fifth exemplary structure of FIG. 26 after spalling in which a spalled structure (100B, 120, 114A, 114B, 102P, 104) is provided. Spalling may be performed as in the previous embodiment of the present application. After spalling and if not done previously, a dopant of the first conductivity type can be introduced into the spalled semiconductor material portion 100B of the spalled structure.

Figure 28:
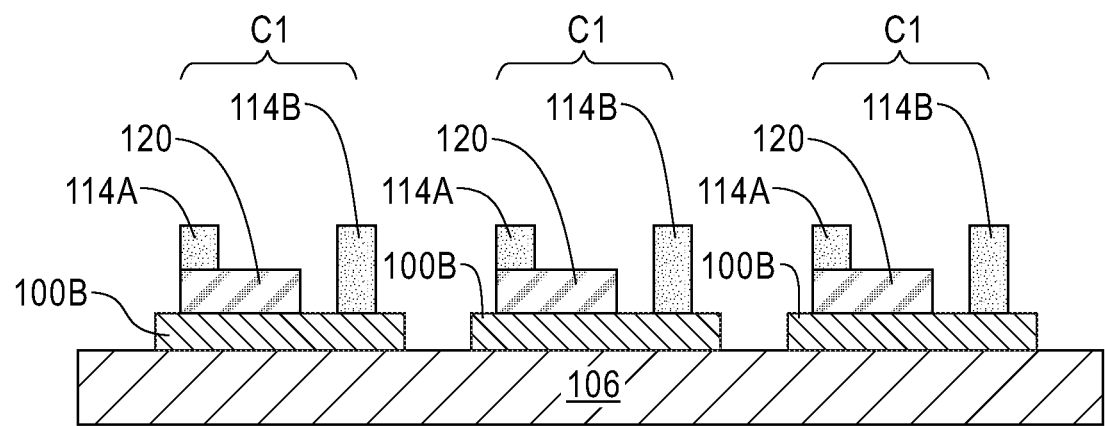
FIG. 28 is a cross sectional view of the spalled structure of FIG. 27 after mounting the spalled structure onto a temporary support substrate, and removing the handle substrate and each discrete metal stressor structure.

Referring now to FIG. 28, there is illustrated the spalled structure (100B, 120, 114A, 114B, 102P, 104) of FIG. 27 after mounting the spalled structure (100B, 120, 114A, 114B, 102P, 104) on a temporary support substrate, and removing the handle substrate 104 and each discrete metal stressor structure 102P. The handle substrate 104 can be removed prior to or after mounting. The handle substrate 104 of this embodiment may be removed as described in the first spalling process of the present application. The mounting of the spalled structure may be performed utilizing the technique mentioned in the first spalling process. The temporary support substrate 106 used in this embodiment is the same as the temporary support substrate 106 used in the first spalling process mentioned above. The metal stressor structures 102P may be removed utilizing any conventional material removal process.

Each LED chiplet includes a bottom semiconductor layer (i.e., spalled semiconductor material portion 100B), the semiconductor layer 120, and top contacts 114A, 114B.

Preselected chiplets, C1, shown in FIG. 28 can then be transferred to a display substrate by releasing the preselected chiplets, C1, from the temporary support substrate 106. The release may include laser ablation or any other technique that is capable of releasing the preselected chiplets, C1, from the temporary support substrate 106. The processing described in FIGS. 26-28 may be repeated at least two more times to form a second set of LED chiplets and a third set of LED chiplets on the display substrate. As in the previous embodiments, the first chiplets emit a first color, the second chiplets emit a second color that differs from the first color, and the third chiplets introduce a third color that is different from both the first and second colors.

Figure 29:
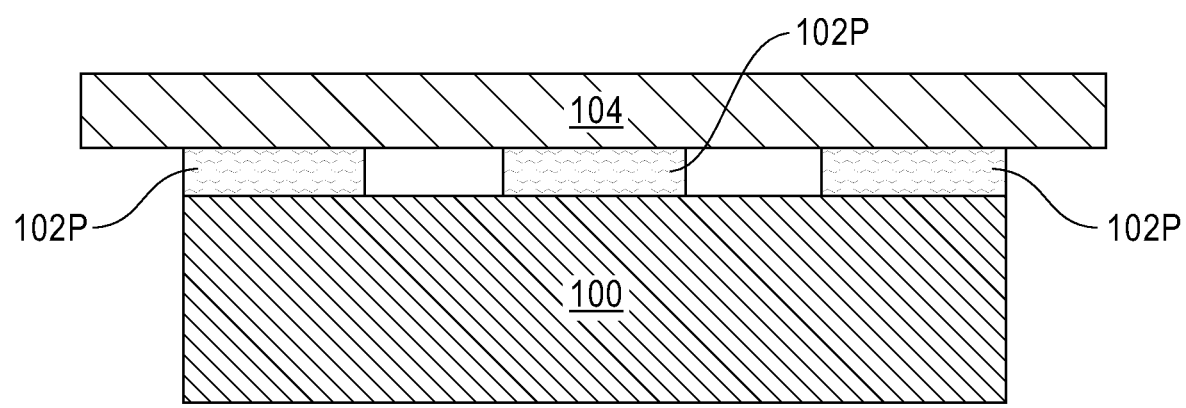
FIG. 29 is a cross sectional view of a sixth exemplary structure that includes discrete metal stressor structures located on a surface of a base semiconductor and a handle substrate located atop each discrete metal stressor structure.

Referring now to FIG. 29, there is illustrated a sixth exemplary structure that can be employed in the present application. The exemplary structure of FIG. 29 includes discrete metal stressor structures 102P located on a surface of a base semiconductor substrate 100 and a handle substrate 104 located atop each discrete metal stressor structure 102P. The base semiconductor substrate 100, the discrete metal stressor structures 102P, and the handle substrate 104 can be composed of materials and can be formed utilizing techniques mentioned above in the previous three spalling embodiments.

Figure 30:
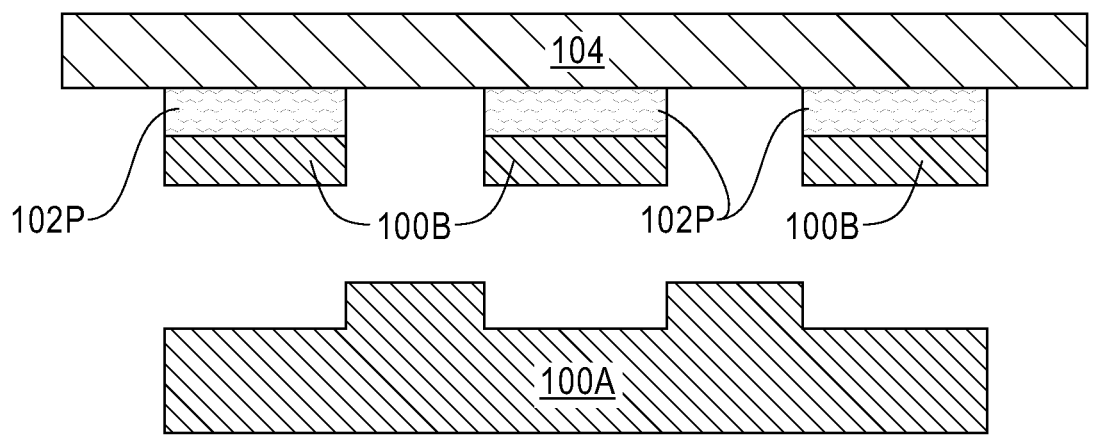
FIG. 30 is a cross sectional of the seventh exemplary structure of FIG. 29 after spalling in which a spalled structure is provided.

Referring now to FIG. 30, there is illustrated the seventh exemplary structure of FIG. 29 after spalling in which a spalled structure (100B, 102P, 104) is provided. Spalling may be performed as in the previous embodiment of the present application. After spalling and if not done previously, a dopant of the first conductivity type can be introduced into the spalled semiconductor material portion 100B of the spalled structure.

Figure 31:
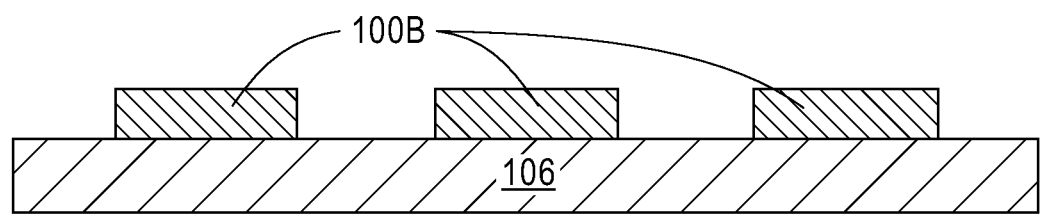
FIG. 31 is a cross sectional view of the spalled structure of FIG. 30 after mounting the spalled structure on a temporary support substrate, and removing the handle substrate and each discrete metal stressor structure.

Referring now to FIG. 31, there is illustrated the seventh exemplary structure of FIG. 30 after mounting the spalled structure (100B, 102P, 104) on a temporary support substrate 106, and removing the handle substrate 104 and each discrete metal stressor structure (102P). The handle substrate 104 can be removed prior to or after mounting. The handle substrate 104 of this embodiment may be removed as described in the first spalling process of the present application. The mounting of the spalled structure may be performed utilizing the technique mentioned in the first spalling process. The temporary support substrate 106 used in this embodiment is the same as the temporary support substrate 106 used in the first spalling process mentioned above. The metal stressor structures 102P may be removed utilizing any conventional material removal process.

Figure 32:
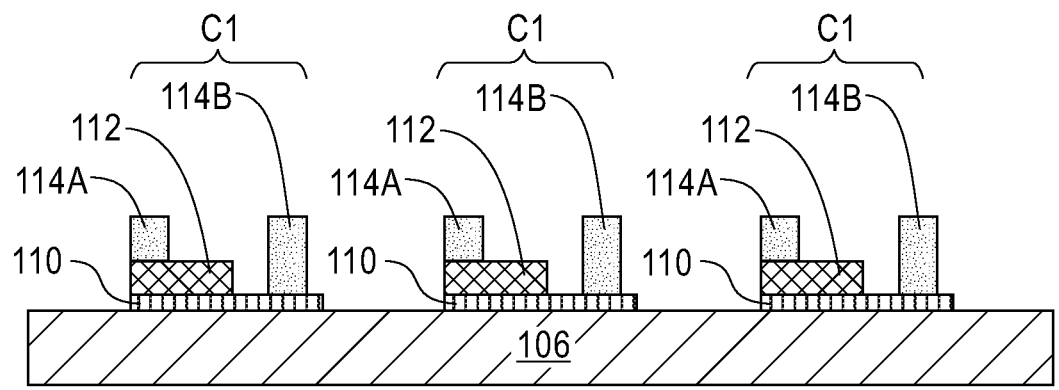
FIG. 32 is a cross sectional view of the sixth exemplary structure of FIG. 31 after LED processing.

Referring now to FIG. 32, there is illustrated the seventh exemplary structure of FIG. 31 after LED processing. The LED processing forms LED chiplets, C1, of a first set of LED chiplets on the temporary support substrate 106. Each LED chiplet, C1, includes a first semiconductor material layer 110 of a first conductivity type, a second semiconductor material layer 112 of a second conductivity type that is opposite from the first conductivity type, and top contact structures 114A and 114B. As is shown, top contact structure 114A is in direct contact with a topmost surface of the second semiconductor material layer 112, while the second top contact structure 114B is in direct contact with a topmost surface of the first semiconductor material layer 110. The LED processing used in this embodiment is the same as mentioned above in forming the LEDs shown in FIG. 21. The processing described in FIGS. 29-32 may be repeated at least two more times to form a second set of LED chiplets and a third set of LED chiplets on the display substrate. As in the previous embodiments, the first chiplets emit a first color, the second chiplets emit a second color that differs from the first color, and the third chiplets introduce a third color that is different from both the first and second colors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a structure, the method comprising:
providing, in any order, a first structure containing a plurality of spaced apart adhesive structures composed of a photoimageable polymeric material on a surface of a release layer that is located on a handler substrate, and a second structure containing a first set of LEDs on a temporary support substrate;
first transferring a preselected number of LEDs of the first set of LEDs to the first structure by adhering a physically exposed surface of each adhesive structure to one of the preselected number of LEDs of the first set of LEDs; and
second transferring the preselected number of LEDs of the first set of LEDs from the first structure to a surface of a display substrate, wherein the second transferring includes contacting another physically exposed surface of each of the preselected number of LEDs of the first set of LEDs to the surface of the display substrate and removing the release layer.

2. The method of claim 1, wherein the release layer is a laser ablatable material, and the removing the release layer comprises laser ablation.

3. The method of claim 1, wherein the release layer is an etchant dissolvable material, and the removing comprises contacting the release layer with an etchant.

4. The method of claim 1, wherein the second transferring also transfers each adhesive structure that is located on the preselected number of LEDs of the first set of LEDs, and wherein each adhesive structure is removed after the second transferring.

5. The method of claim 1, wherein each LED of the first set of LEDs emits a first color.

6. The method of claim 5, further comprising providing a second set of LEDs that emit a second color that is different from the first color and a third set of LEDs that emit a third color that is different from both the first color and the second color to the display substrate.

7. The method of claim 6, wherein the providing the second set of LEDs comprises:
providing, in any order, another first structure containing a plurality of spaced apart adhesive structures composed of a photoimageable polymeric material on a surface of a release layer that is located on a handler substrate, and another second structure containing the second set of LEDs on a temporary support substrate;
first transferring a preselected number of LEDs of the second set of LEDs to the another first structure by adhering a physically exposed surface of each adhesive structure to one of the preselected number of LEDs of the second set of LEDs; and
second transferring the preselected number of LEDs of the second set of LEDs from the another first structure to the display substrate, wherein the second transferring includes contacting a physically exposed surface of each of the preselected number of LEDs of the second set of LEDs to the surface of the display substrate and removing the release layer.

8. The method of claim 7, wherein the providing the third set of LEDs comprises:
providing, in any order, yet another first structure containing a plurality of spaced apart adhesive structures composed of a photoimageable polymeric material on a surface of a release layer that is located on a handler substrate, and yet another second structure containing the third set of LEDs on a temporary support substrate;
first transferring a preselected number of LEDs of the third set of LEDs to the yet another first structure by adhering a physically exposed surface of each adhesive structure to one of the preselected number of LEDs of the third set of LEDs; and
second transferring the preselected number of LEDs of the third set of LEDs from the yet another first structure to the display substrate, wherein the second transferring includes contacting a physically exposed surface of each of the preselected number of LEDs of the third set of LEDs to the surface of the display substrate and removing the release layer.

9. A method of providing a structure, the method comprising:
providing, in any order, a first structure containing a release layer that is located on a handler substrate, and a second structure containing a first set of LEDs on a temporary support substrate, wherein an adhesive structure composed of a photoimageable polymeric material is located on a surface of a preselected number of the LEDs of the first set of LEDs, and each adhesive structure is spaced apart from one another;

first transferring the preselected number of LEDs of the first set of LEDs to the release layer of the first structure by adhering a physically exposed surface of each adhesive structure to the release layer; and second transferring the preselected number of LEDs of the first set of LEDs from the first structure to a surface of a display substrate, wherein the second transferring includes contacting a physically exposed surface of each of the preselected number of LEDs of the first set of LEDs to the surface of the display substrate and removing the release layer.

10. The method of claim 9, wherein the release layer is a laser ablatable material, and the removing the release layer comprises laser ablation.

11. The method of claim 9, wherein the release layer is an etchant dissolvable material, and the removing comprises contacting the release layer with an etchant.

12. The method of claim 9, wherein the second transferring also transfers each adhesive structure that is located on the preselected number of LEDs of the first set of LEDs, and wherein each adhesive structure is removed after the second transferring.

13. The method of claim 9, wherein each LED of the first set of LEDs emits a first color.

14. The method of claim 13, further comprising providing a second set of LEDs that emit a second color that is different from the first color and a third set of LEDs that emit a third color that is different from both the first color and the second color to the display substrate.

15. The method of claim 14, wherein the providing the second set of LEDs comprises providing, in any order, another first structure containing a release layer that is located on a handler substrate, and another second structure containing the second set of LEDs on a temporary support substrate, wherein an adhesive structure composed of a photoimageable polymeric material is located on a surface of a preselected number of the LEDs of the second set of LEDs;

first transferring the preselected number of LEDs of the second set of LEDs to the release layer of the another first structure by adhering a physically exposed surface of each adhesive structure to the release layer; and second transferring the preselected number of LEDs of the second set of LEDs from the another first structure to the display substrate, wherein the second transferring includes contacting a physically exposed surface of each of the preselected number of LEDs of the second set of LEDs to the surface of the display substrate and removing the release layer.

16. The method of claim 15, wherein the providing the third set of LEDs comprises providing, in any order, a yet another first structure containing a release layer that is located on a handler substrate, and yet another second structure containing the third set of LEDs on a temporary support substrate, wherein an adhesive structure composed of a photoimageable polymeric material is located on a surface of a preselected number of the LEDs of the third set of LEDs;

first transferring the preselected number of LEDs of the third set of LEDs to the release layer of the yet another first structure by adhering a physically exposed surface of each adhesive structure to the release layer; and second transferring the preselected number of LEDs of the third set of LEDs from the yet another first structure to the display substrate, wherein the second transferring includes contacting a physically exposed surface of each of the preselected number of LEDs of the third set of LEDs to the surface of the display substrate and removing the release layer.

17. A method of providing a structure, the method comprising:

providing, utilizing a spalling process in which crack formation and propogation within a substrate is induced by a metal stressor material, a first set of LED chiplets on a surface of a temporary support substrate; and transferring a predetermined number of LED chiplets of the first set of LED chiplets to a display substrate by releasing the predetermined number of LED chiplets from the temporary support substrate.

18. The method of claim 17, wherein the temporary support substrate is a laser ablatable material, and the releasing comprises laser ablation.

19. The method of claim 17, wherein the temporary support substrate is an etchant dissolvable material, and the releasing comprises contacting the temporary support substrate with an etchant.

20. The method of claim 17, wherein the spalling process is a non-selective spalling process.

21. The method of claim 20, wherein the non-selective spalling process comprises:

providing a material stack of a base semiconductor substrate, a metal stressor layer, and a handler layer; and removing an upper portion of the base semiconductor substrate by pulling or peeling the handle substrate.

22. The method of claim 21, further comprising performing LED processing using a spalled material portion of the base semiconductor substrate as semiconductor materials of each LED chiplet.

23. The method of claim 21, wherein a first set of pre-LED chiplets is located on the surface of the base semiconductor substrate prior to the removing the upper portion of the base semiconductor substrate, and wherein the spalled portion of the base semiconductor material forms a lower semiconductor layer of each LED chiplet.

24. The method of claim 17, wherein the spalling process is a selective spalling process.

25. The method of claim 24, wherein the selective spalling process comprises:

providing a material stack of a base semiconductor substrate, discrete metal stressor structures, and a handler layer; and removing an upper portion of the base semiconductor substrate by pulling or peeling the handle substrate.

26. The method of claim 25, further comprising performing LED processing using a spalled material portion of the base semiconductor substrate as semiconductor materials of each LED chiplet.

27. The method of claim 24, wherein a first set of pre-LED chiplets is located on the surface of the base semiconductor substrate prior to the removing the upper portion of the base semiconductor substrate and each pre-LED chiplet is laterally surrounded by one of the discrete metal stressor structures, and wherein the spalled portion of the base semiconductor material forms a lower semiconductor layer of each LED chiplet.

28. The method of claim 17, wherein each LED chiplet of the first set of LED chiplets emits a first color.

29. The method of claim 28, further comprising providing a second set of LED chiplets that emit a second color that is different from the first color and a third set of LED chiplets that emit a third color that is different from both the first color and the second color to the display substrate.

\* \* \* \* \*